United States Patent
Oumi et al.

(10) Patent No.: US 7,952,272 B2
(45) Date of Patent: May 31, 2011

(54) ELECTROLUMINESCENCE ELEMENT HAVING METAL PARTICLES DISPERSED IN LIGHT SCATTERING LAYER

(75) Inventors: Manabu Oumi, Chiba (JP); Masayuki Suda, Chiba (JP); Shuhei Yamamoto, Chiba (JP); Mitsuru Suginoya, Chiba (JP); Shigeru Senbonmatsu, Chiba (JP)

(73) Assignee: Seiko Instruments Inc. (JP)

( * ) Notice: Subject to any disclaimer, the term of this patent is extended or adjusted under 35 U.S.C. 154(b) by 1237 days.

(21) Appl. No.: 11/591,875

(22) Filed: Nov. 2, 2006

(65) Prior Publication Data

US 2007/0114523 A1    May 24, 2007

(30) Foreign Application Priority Data

Nov. 18, 2005  (JP) .................... 2005-333694
Sep. 27, 2006  (JP) .................... 2006-262568

(51) Int. Cl.
*H05B 33/00*  (2006.01)

(52) U.S. Cl. ...................... 313/506; 313/112

(58) Field of Classification Search .......... 313/110–113, 313/504–512

See application file for complete search history.

(56) References Cited

U.S. PATENT DOCUMENTS

2004/0012980 A1*  1/2004  Sugiura et al. ............ 362/560

\* cited by examiner

*Primary Examiner* — Joseph L Williams
(74) *Attorney, Agent, or Firm* — Adams & Wilks

(57) ABSTRACT

In an EL element including a light emitting layer sandwiched between upper and lower electrodes, of light emitted therefrom, light totally reflected at a light emitting layer interface is not taken out, so there is a problem in that light emission efficiency reduces. Therefore, a light scattering layer in which metal particles are dispersed is provided between an electrode and the light emitting layer. According to such a structure, the light from the light emitting layer can be scattered by the metal particles and taken out, thereby improving the light emission efficiency. When plasmon is excited in the metal particles, light confined in the light emitting layer or each layer adjacent thereto can be used, thereby improving light use efficiency.

36 Claims, 8 Drawing Sheets

SCATTERED LIGHT

SCATTERED LIGHT

SCATTERED LIGHT

SCATTERED LIGHT

SCATTERED LIGHT

SCATTERED LIGHT

SCATTERED LIGHT

SCATTERED LIGHT

SCATTERED LIGHT

PRIOR ART

ELECTROLUMINESCENCE ELEMENT HAVING METAL PARTICLES DISPERSED IN LIGHT SCATTERING LAYER

BACKGROUND OF THE INVENTION

1. Field of the Invention

The present invention relates to an electroluminescence element (hereinafter referred to as EL element) used for a planar light emitter, a display device, and the like, and more particularly, to an EL element in which a light scattering film is provided near a light emitting layer to improve light emission efficiency.

2. Description of the Related Art

Up to now, an inorganic EL element including a light emitting layer made of an inorganic material has been known. In recent years, an organic EL element using a low-molecular organic film or a polymer organic film as the light emitting layer has been under development. The EL elements have a feature that a device is thin and light is emitted at low power consumption. Therefore, the EL elements have been put into practical use for a planar light emitter for illuminating a liquid crystal display. In addition, the EL elements have been under research and development for a full color image display device in which pixels are arranged in dot matrix.

FIG. 13 shows a cross sectional structure of a full color display type EL element which is known up to now. As shown in FIG. 13, rear electrodes 52 are formed on a glass substrate 51. An insulating layer 53, three light emitting layers 54, 55, and 56, a display-side insulating layer 57, and transparent electrodes 58 are stacked on the rear electrodes 52 in this order. Each of the rear electrodes 52 is a stripe electrode extending in a direction parallel to the paper surface of FIG. 13. Each of the transparent electrodes 58 is a stripe electrode extending in a direction perpendicular to the paper surface of FIG. 13. A color filter layer 59 is formed to cover the transparent electrodes 58. The three light emitting layers 54, 55, and 56 are a green light emitting layer of ZnS:Tb, F, a blue-green light emitting layer of SrS:Ce, and a yellow-orange light emitting layer of ZnS:Mn, respectively, which are stacked in this order. The color filter layer 59 includes a red light transmission filter 59r, a green light transmission filter 59g, and a blue light transmission filter 59b, which are separated from one another and formed to cover the transparent electrodes 58. Such the structure is described in, for example, JP 01-315988 A.

In the EL element, a driving voltage is applied between each of the rear electrodes 52 and each of the transparent electrodes 58 to emit light from each of the light emitting layers 54, 55, and 56 located at intersections therebetween. Green (hereinafter referred to as G) light, red-orange (hereinafter referred to as R) light, and blue (hereinafter referred to as B) light are simultaneously emitted from the light emitting layers, so white light is obtained. When the white light reaches the color filter layer 59, light of a color other than a corresponding color of the color filter layer 59 is absorbed for each of pixels located at the intersections and only light of the corresponding color of the color filter layer 59 passes therethrough. Therefore, much of emitted light is absorbed by the color filter layer 59.

Actual scan-driving is performed by line-sequentially selecting a large number of rear electrodes 52 or a large number of transparent electrodes 58 which are provided in a stripe shape and separated from one another. That is, assume that the transparent electrodes 58 are used as scanning electrodes and the rear electrodes 52 are used as signal electrodes. In this case, while one of the transparent electrodes 58 is selected, signal voltages are supplied to the rear electrodes 52 to emit light from a light emitting layer located at each intersection portion between the selected transparent electrode and each of the rear electrodes 52. Such an operation is sequentially repeated for scanning, thereby realizing full color display.

Light generated in a light emitting layer includes not only light emitted from the surface of the light emitting layer in a perpendicular direction but also light confined in the light emitting layer. For example, when the light emitting layer 54 (or light emitting layer 56) has a larger refractive index to visible light than the insulating layer 53 (or display-side insulating layer 57) in the above-mentioned conventional structure, light in a lateral direction is totally reflected at an interface between the insulating layer and the light emitting layer. Therefore, the light cannot be taken out from the light emitting layer, so the light is confined in the light emitting layer. Thus, there is a problem in that the light emission efficiency of the EL element used for the planar light emitter reduces. Even when the refractive indexes of the light emitting layers 54, 55, and 56 and the insulating layer 53 (or display-side insulating layer 57) become lower toward the outside, the generated light is likely to be confined in each of the light emitting layers. This causes a reduction in light emission efficiency of the EL element used for the planar light emitter.

In the above-mentioned known example used for the full color display device, much of light emitted from the light emitting layers 54, 55, and 56 is absorbed by the color filter layer 59. For example, when the color filter layer 59 is caused to transmit a blue light beam, a green light beam and a red-orange light beam are absorbed thereby, and when the color filter layer 59 is caused to transmit the red-orange light beam, the blue light beam and the green light beam are absorbed thereby. Therefore, there is a problem in that the amount of light taken out for display necessarily reduces.

SUMMARY OF THE INVENTION

Thus, according to the present invention, an EL element includes a first electrode layer, a second electrode layer, a light emitting layer located therebetween, and a light scattering layer which is formed between the first electrode layer and the light emitting layer and includes dispersed metal particles. A metal selected from the group consisting of Au, Ag, Pt, Co, and W or an alloy thereof is used for the metal particles. In those metal particles, surface plasmon can be excited.

Further, the light scattering layer is formed of a film in which the metal particles, each having a particle diameter is in a range of 1 nm to 300 nm, are disposed in a dielectric material. The light scattering layer may be formed of a film in which the metal particles, which have different ratios of a minor axis to a major axis, are disposed in a dielectric material. Each of the metal particles may have a particle diameter equal to a thickness of the light scattering layer.

The EL element further includes a second light scattering layer located between the second electrode layer and the light emitting layer.

Alternatively, the light scattering layer may not be located between the first electrode layer and the light emitting layer but be provided on the second light scattering layer.

Further, at least one of the first electrode layer and the second electrode layer includes a plurality of electrodes separated from one another and a pixel is provided in a stack portion in which the first electrode layer and the second electrode layer overlap each other. The light scattering layer includes a first light scattering region corresponding to a first pixel and a second light scattering region corresponding to a second pixel. Scattered light emitted from the first light scattering region has a wavelength characteristic different from a wavelength characteristic of scattered light emitted from the second light scattering region.

According to the present invention, the light scattering layer in which the metal particles are dispersed is provided near the light emitting layer. Therefore, the light emission efficiency of the EL element used for a planar light emitter can be improved.

DETAILED DESCRIPTION OF THE PREFERRED EMBODIMENTS

Figure 1:
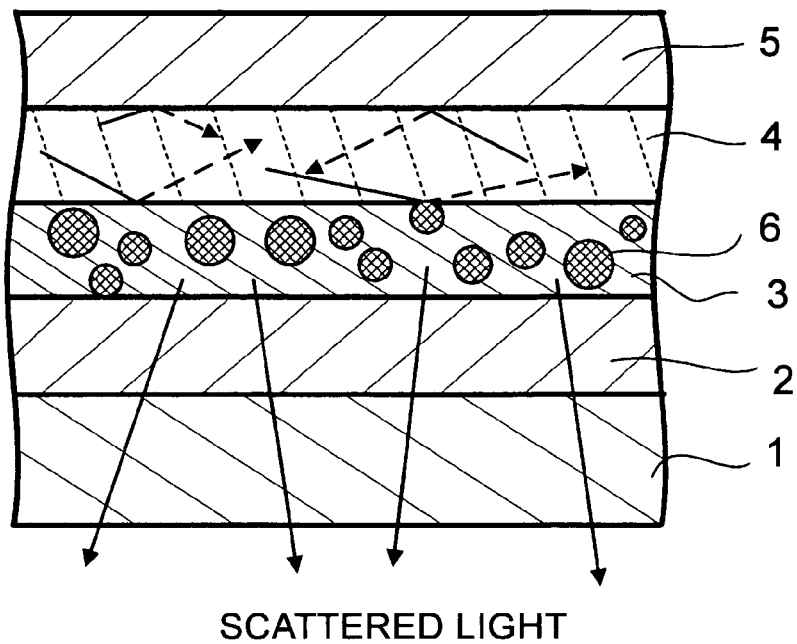
FIG. 1 is a schematic partial cross sectional view showing an EL element according to Embodiment 1 of the present invention.

An EL element according to the present invention includes a first electrode layer, a second electrode layer, a light emitting layer located therebetween, and a light scattering layer which is formed between the first electrode layer and the light emitting layer and includes dispersed metal particles. FIG. 1 shows a schematic cross sectional view showing such a structure of the EL element. The structure shown in FIG. 1 is suitable for an EL element used as a planar light emitting plate of, for example, an illumination device. In FIG. 1, the above-mentioned constituent elements are provided on a substrate 1. According to the structure in which a light scattering layer 3 in which metal particles 6 are dispersed is provided near a light emitting layer 4, light emitted from the light emitting layer 4 is incident on the light scattering layer 3 and collides with the metal particles 6. Then, the light is diffusely reflected to a first electrode layer 2 side. Therefore, the light can be taken out as scattered light.

A metal selected from the group consisting of Au, Ag, Pt, Co, and W or an alloy thereof is used for the metal particles 6. Alternatively, particles in which surface plasmon is excited are used as the metal particles 6. According to such a structure, electrons of the metal particles 6 resonate with near-field light generated by total reflection of light at an interface between the light emitting layer 4 and the light scattering layer 3. Then, plasmon is excited and light is emitted thereby. The emitted light is taken out. Therefore, the light totally reflected at the interface between the light emitting layer and the light scattering layer, that is, the light confined in the light emitting layer can be scattered to an outside of the light emitting layer. Thus, light use efficiency, that is, light emission efficiency of the EL element used for a planar light emitter can be improved.

When a particle diameter of each of the metal particles becomes 300 nm or less, the metal particles interact with the near-field light, so plasmon is excited. The plasmon means a state in which the electrons of the metal particles resonate with the electric field of light. The plasmon is also excited by the resonance between the near-field light (which is called evanescent light) and the electrons of the metal particles in a case where light from a material whose refractive index is large is incident on a material whose refractive index is small at an angle equal to or smaller than a critical angle to be totally reflected and soaks to the material whose refractive index is small, or in a case where light penetrates through an opening portion when the light is incident on the opening portion having a diameter smaller than a wavelength of the light.

For example, when the light generated in the light emitting layer is incident on the light scattering layer whose refractive index is small from the light emitting layer whose refractive index is large at an angle equal to or smaller than the critical angle to be totally reflected, near-field light is generated in a region of several 100 nm or less which is near an interface of the light scattering layer whose refractive index is small. The near-field light interacts with the free electrons of the metal particles dispersed in the light scattering layer. As a result, light is emitted by the free electrons vibrated with resonance and the emitted light is scattered to the outside of the light scattering layer. An peak intensity of the emitted light is changed according to a particle diameter of each of the metal particles and a ratio between a major axis (a long axis) of each of the metal particles and a minor axis (a short axis) thereof.

Metal particles, each having a particle diameter in a range of 1 nm to 300 nm, are dispersed in the light scattering layer. Therefore, even when light emitted from the light emitting layer has different wavelengths, scattered light having a desirable wavelength can be taken out. Even when several kinds of metal particles, which have different ratios of a minor axis to a major axis, are dispersed in the light scattering layer, the same effect can be obtained.

Each of the metal particles may be composed of a substantially spherical core portion made of a dielectric material and a thin film formed on the surface of the core portion. Assume that multiple kinds of metal particles, in each of which the core portion and the metal thin film are different in size, are mixed in the light scattering layer. In this case, even when the light emitted from the light emitting layer has different wavelengths, scattered light having a desirable wavelength can be taken out. Each of the metal particles may be a cluster in which a plurality of particles are coagulated.

The EL element having the above-mentioned structure is used as an illumination device for a non-self light emitting display element. For example, the EL element can be used for an illumination device for a liquid crystal panel to construct a display device.

Next, a structure in which the EL element according to the present invention is used for the display device will be described. That is, the EL element according to the present invention is an EL element in which at least one of a first electrode layer and a second electrode layer includes a plurality of electrodes separated from one another, a pixel is provided in a stack portion in which the first electrode layer and the second electrode layer overlap each other, and a light emitting layer and a light scattering layer in which metal particles are dispersed are located between the first electrode layer and the second electrode layer. A structure is used, in which the light scattering layer includes a first light scattering region corresponding to a first pixel and a second light scattering region corresponding to a second pixel and a wavelength characteristic of scattered light emitted from the first light scattering region is different from a wavelength characteristic of scattered light emitted from the second light scattering region. According to the structure, even when the light emitting layer is used for single color, scattered light color can be adjusted corresponding to a pixel, so multicolor display is possible. The EL element having the above-mentioned structure can be used not only for the display device but also for the illumination device whose emitted light color is changed according to a position.

Alternatively, a structure is used in which the light scattering layer includes a first light scattering region corresponding to a first pixel and a second light scattering region corresponding to a second pixel and a shape of each of metal particles included in the first light scattering region is different from a shape of each of metal particles included in the second light scattering region.

Therefore, even when the light emitting layer emits light having a specific property, light scattered by the first light scattering region and light scattered by the second light scattering region can be obtained as scattered light beams whose properties are different from each other. For example, a wavelength of the light scattered from the first light scattering region can be made different from a wavelength of the light scattered from the second light scattering region. Alternatively, a scattering angle of the light scattered from the first light scattering region can be made different from a scattering angle of the light scattered from the second light scattering region.

To be more specific, an average particle diameter of each of the metal particles of the second light scattering region is set to a value larger than an average particle diameter of each of the metal particles of the first light scattering region. In a case where plasmon is excited in the metal particles and thus light is scattered, when a particle diameter of each of the metal particles increases, a wavelength of scattered light is shifted to a long-wavelength side. Therefore, for example, a color of the light scattered by the first light scattering region can be set to a green group and a color of the light scattered by the second light scattering region can be set to a red group. That is, different emitted light colors can be assigned to different pixels.

With respect to a shape ratio of a minor axis of each of the metal particles to a major axis thereof, an average shape ratio of the metal particles of the second light scattering region is set to a value larger than an average shape ratio of the metal particles of the first light scattering region. In the case where plasmon is excited in the metal particles and thus light is scattered, when the shape ratio of each of the metal particles increases, the wavelength of scattered light is shifted to the long-wavelength side. Therefore, as in a case of the average particle diameter, different emitted light colors can be assigned to different pixels.

Alternatively, the light emitting layer includes a first dielectric layer and a second dielectric layer. A permittivity of the first dielectric layer constituting a first light scattering region corresponding to a first pixel in the light scattering layer is different from a permittivity of the second dielectric layer constituting a second light scattering region corresponding to a second pixel.

Alternatively, a dielectric layer is provided between the light emitting layer and the light scattering layer. The light scattering layer includes a first light scattering region corresponding to a first pixel and a second light scattering region corresponding to a second pixel. A film thickness of the dielectric layer is changed between a first portion corresponding to the first light scattering region and a second portion corresponding to the second light scattering region. When the film thickness of the dielectric layer is changed between the respective portions, a voltage or a current which is applied to a light emitting layer corresponding to a first pixel region and a light emitting layer corresponding to a second pixel region is changed therebetween. Therefore, the uniform light emission intensity can be realized. For example, when a light emission intensity of a pixel corresponding to the first portion is larger than a light emission intensity of a pixel corresponding to the second portion, a light intensity distribution of the respective pixels is unbalanced. Thus, the film thickness of the dielectric layer corresponding to each of the pixel regions is suitably set, so the intensities of scattered light beams from the light emitting layers and the light scattering layers in the respective pixels can be made equal to one another.

Each of the metal particles to be used here is a particle in which a metal thin film is formed on a surface of a substantially spherical core portion containing a dielectric material. The core portion and the metal thin film of each of the metal particles are changed in size between the first light scattering region and the second light scattering region. Therefore, wavelength dependence is given to the scattering efficiency of each of the light scattering regions, with the result that multicolor display can be performed using a light emitting layer for signal color.

An EL element for performing multicolor display using light scattering layers corresponding to three primary colors will be described in detail. In the EL element, at least one of the first electrode layer and the second electrode layer is divided into three electrode groups. A first pixel, a second pixel, and a third pixel are provided in a stack portion in which the first electrode layer and the second electrode layer overlap each other. The light scattering layer includes a first light scattering region corresponding to the first pixel, a second light scattering region corresponding to the second pixel, and a third light scattering region corresponding to the third pixel. A size of each of metal particles dispersed in the first light scattering region is in a range of 10 nm to 50 nm. A size of each of metal particles dispersed in the second light scattering region is in a range of 50 nm to 90 nm. A size of each of metal particles dispersed in the third light scattering region is in a range of 90 nm to 140 nm. Therefore, color display can be performed by the combination of three primary colors of R, G, and B.

Examples of each of the metal particles include a particle containing a metal selected from the group consisting of Au, Ag, Pt, Co, and W or an alloy thereof and a particle in which plasmon is excited.

Hereinafter, embodiments of the present invention will be described in detail with reference to the accompanying drawings.

Embodiment 1

An EL element according to this embodiment will be described with reference to FIG. 1. As shown in FIG. 1, the first electrode layer 2 which is transparent is formed on the substrate 1 which is transparent. Then, the light scattering layer 3 in which the metal particles 6 are dispersed in a dielectric material is formed on the first electrode layer 2. Then, the light emitting layer 4 and a second electrode layer 5 are formed on the light scattering layer 3. In this embodiment, the EL element used as a planar light emitting plate will be described. The EL element can be used for an illumination device provided in the rear of a liquid crystal display device. As shown in FIG. 1, the light scattering layer in which the metal particles are dispersed is formed between the first electrode layer and the light emitting layer. Therefore, light collides with the metal particles, so the light can be taken out.

A voltage is applied between the first electrode layer and the second electrode layer to flow a current therebetween, thereby injecting high-energy electrons into the light emitting layer. Then, the electrons recombine with holes to emit light from the EL element. The light generated in the light emitting layer travels in a direction parallel thereto or a direction perpendicular thereto. In some cases, the generated light is confined in the light emitting layer by a light refractive index difference between the light emitting layer and the light scattering layer or between the light emitting layer and the second electrode layer or a refractive index distribution. When the refractive index of the light emitting layer 4 is larger than the refractive index of the light scattering layer 3, light is totally reflected at the interface between the light emitting layer 4 and the light scattering layer 3 at a light incident angle. When the light is totally reflected at the interface between the light emitting layer 4 and the light scattering layer 3, near-field light generates in the light scattering layer 3. Therefore, a metal selected from the group consisting of Au, Ag, Pt, Co, and W or an alloy thereof is used for the metal particles 6. Alternatively, particles in which surface plasmon is excited is used as the metal particles 6. According to such a structure, the electrons of the metal particles 6 resonate with the near-field light to excite the plasmon. Apart of the incident light is emitted again by the plasmon and scattered to the outside of the substrate 1. That is, the light confined in the light emitting layer can be taken out by the metal particles 6. As a result, the light traveling in the lateral direction can be also taken out, so the light emission efficiency of the EL element used for a light emitter can be improved.

Whether or not the light is totally reflected at the interface between the light emitting layer and the light scattering layer depends on the light incident angle. A maximum total reflection angle is called a critical angle. A percentage of light confined in the light emitting layer increases as the refractive index of the light emitting layer becomes larger than the refractive index of the light scattering layer.

A wavelength of the light emitted by the plasmon depends on the particle diameter of each of the metal particles 6. That is, when the particle diameter becomes larger, the wavelength of scattered light is shifted to a long-wavelength side. Therefore, the particle diameter of each of the metal particles 6 is set for dispersion distribution in a range of, for example, 1 nm to 300 nm. Thus, of light generated in the light emitting layer 4, light having a desirable wavelength can be selectively scattered. It is preferable that the above-mentioned structure be used for a backlight of a liquid crystal display device.

Figure 2:
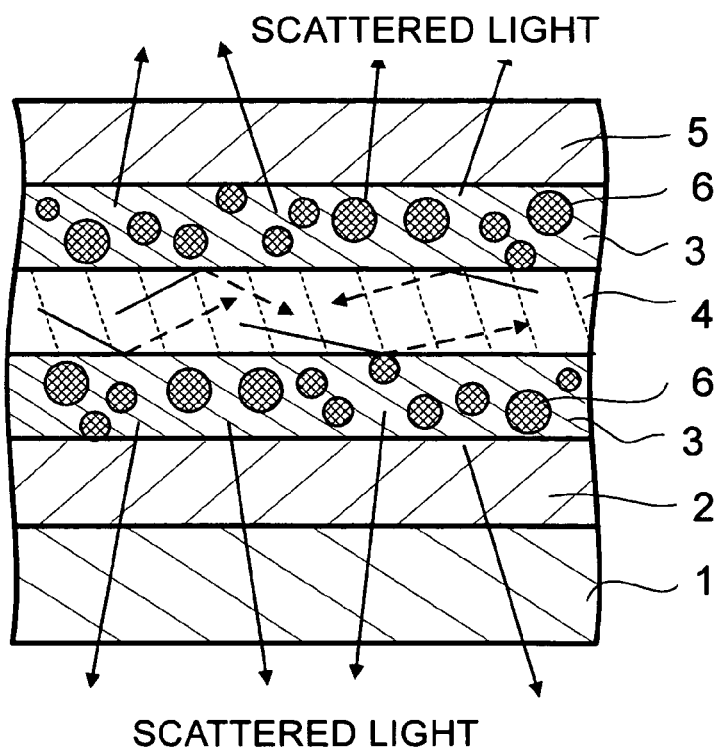
FIG. 2 is a schematic partial cross sectional view showing a double-sided light emitting type EL element according to Embodiment 1 of the present invention.

FIG. 2 schematically shows an EL element having a structure in which a light emitting layer is sandwiched between two light scattering layers. The EL element shown in FIG. 2 is different from the EL element shown in FIG. 1 in that a second light scattering layer 3 is provided between the second electrode layer 5 and the light emitting layer 4. Other structures are identical to those of FIG. 1 and the redundant descriptions are omitted here. When a transparent electrode is used as the second electrode layer 5, scattered light can be obtained not only on the substrate 1 side but also on the second electrode layer 5 side. That is, when the structure is used, a double-sided light emitting type EL element can be realized.

Figure 3:
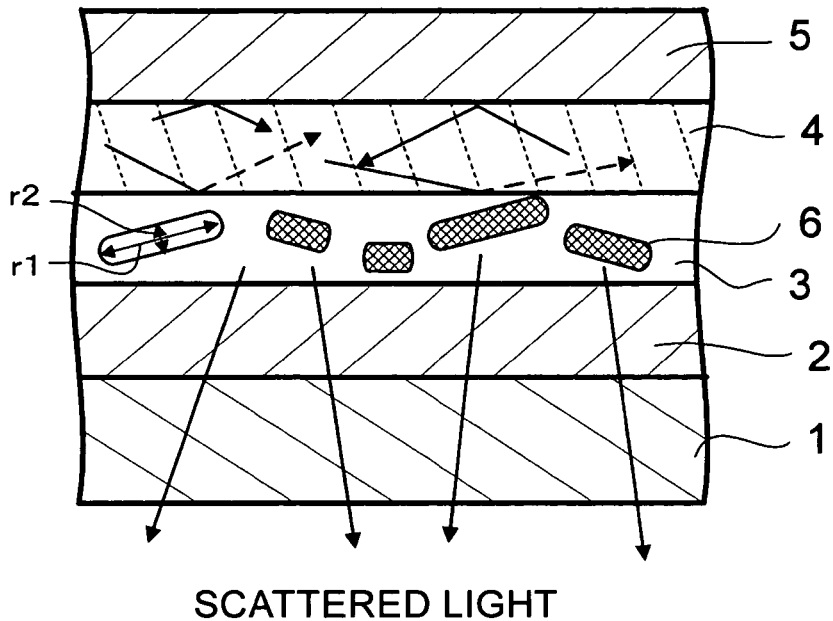
FIG. 3 is a schematic partial cross sectional view showing the EL element according to Embodiment 1 of the present invention.

FIG. 3 schematically shows an EL element having a structure in which not spherical particles but a spherical particles each having a major axis and a minor axis are used as the metal particles 6 contained in the light scattering layer 3. Assume that a ratio of a minor axis r2 of each a spherical metal particle to a major axis r1 thereof is a shape ratio. In a case where the shape ratio increases, a wavelength of incident light which is incident on an interface is shifted to a long-wavelength side when the incident light is scattered by the metal particles 6 to produce scattered light. That is, when the metal particles 6 are spherical particles and the particle diameter thereof increases, it is possible to obtain the same effect that the scattered light has a wavelength shifted to the long-wavelength side. An example of the a spherical particle includes a cylindrical or rectangular particle.

Figure 14:
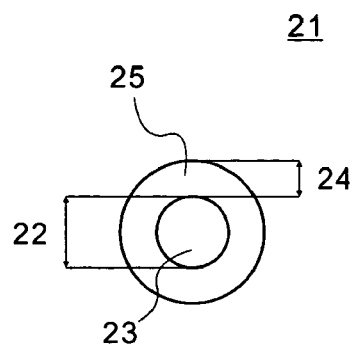
FIG. 14 is a schematic cross sectional view showing a metal particle used in each of Embodiments 1, 2, and 3 of the present invention.

FIG. 14 is a cross sectional view showing another structure of each of the metal particles contained in the light scattering layer 3. Each of the metal particles includes a core portion 23 which is made of a dielectric material and a metal thin film 25 whose surface has a thickness 24. A material of the core portion 23 is, for example, silica. A material of the metal thin film 25 is, for example, Au or Ag. When an absolute value of a diameter 22 of the core portion 23 and an absolute value of the thickness 24 of the metal thin film 25 or a ratio therebetween are adjusted, wavelength dependence can be given to scattering efficiency.

Figure 4:
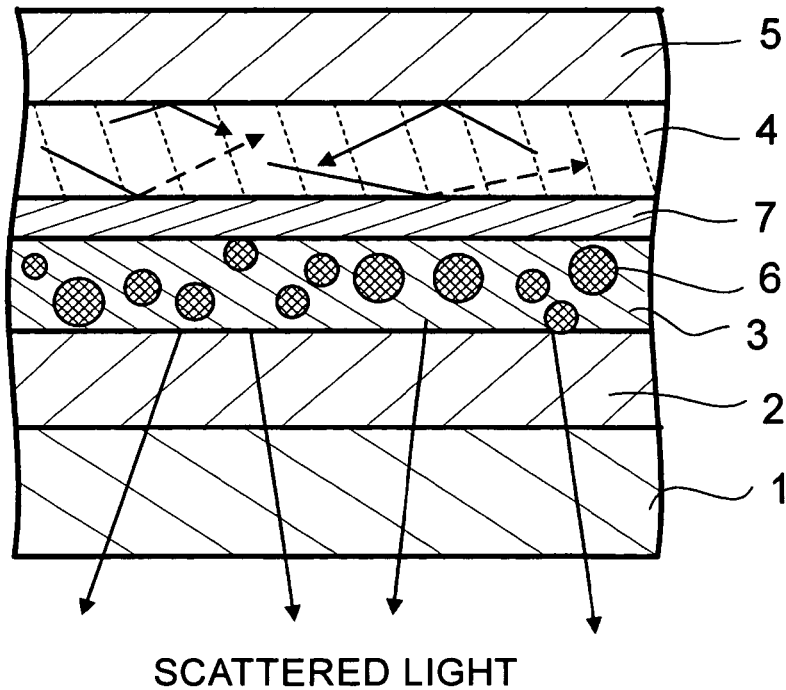
FIG. 4 is a schematic partial cross sectional view showing the EL element according to Embodiment 1 of the present invention.

FIG. 4 schematically shows an EL element having a structure in which a dielectric layer 7 is provided between the light scattering layer 3 and the light emitting layer 4. When the dielectric layer 7 whose refractive index is smaller than the refractive index of the light emitting layer 4 is used, total reflection is caused between the light emitting layer 4 and the dielectric layer 7. When the refractive index of the light scattering layer 3 is set to a value smaller than the refractive index of the dielectric layer 7, total reflection is caused at an interface between the dielectric layer 7 and the light scattering layer 3. When the dielectric layer is thin, the near-field light generated by the total reflection of light penetrates to the light scattering layer. As a result, the electrons of the metal particles in the light scattering layer resonate with the near-field light to excite the plasmon, thereby emitting light. The emitted light is taken out from the substrate 1. When a film thickness of the dielectric layer is in a range of 1 nm to 50 nm, the near-field light can interact with the metal particles of the light scattering layer. When film thickness is changed in this range, light take out efficiency can be adjusted.

As described above, when the dielectric layer is provided between the light scattering layer and the light emitting layer, a condition under which the total reflection is caused at the interface between the dielectric layer and the light emitting layer can be increased. For example, a material whose permittivity is small is used for the dielectric layer and the critical angle is increased, so it is easy to cause the total reflection. Therefore, a larger amount of near-field light can be generated to increase the amount of light scattered by the metal particles.

Figure 5:
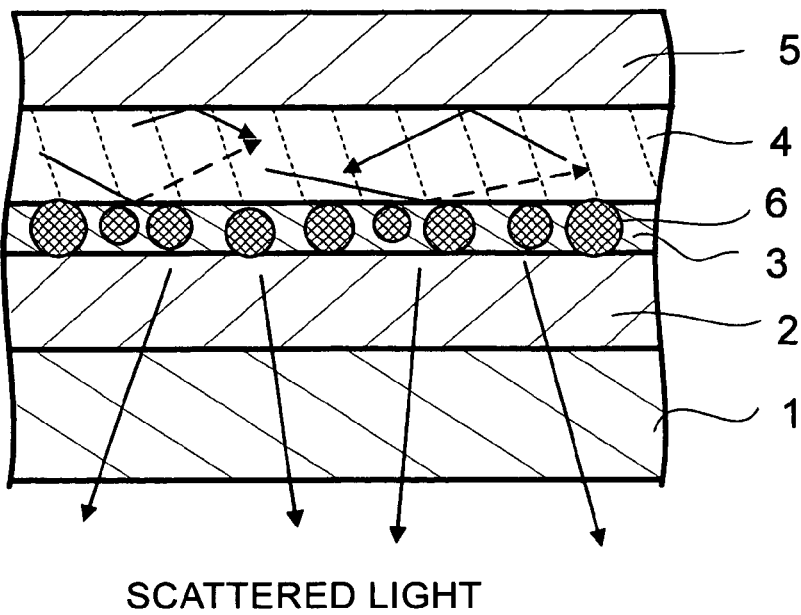
FIG. 5 is a schematic partial cross sectional view showing the EL element according to Embodiment 1 of the present invention.

FIG. 5 schematically shows an EL element having a structure in which the film thickness of the light scattering layer 3 is made substantially equal to the particle diameter of each of the metal particles 6. For example, when the particle diameter of each of the metal particles 6 is several 10 nm, the film thickness of the light scattering layer 3 is set to several 10 nm. According to the structure, the first electrode layer can be made in direct contact with the light emitting layer by electrical contact with the metal particles. An insulating dielectric material is normally used for the light scattering layer, when an inorganic EL layer is used as the light emitting layer 4, an electric field applied to the light emitting layer can be prevented from reducing. When an organic EL layer is used as the light emitting layer 4, the flow of electrons injected into the light emitting layer can be prevented from being blocked. Therefore, the efficiency of injection of electrons or holes from the first electrode layer to the light emitting layer can be improved. In addition, the light confined in the light emitting layer can be scattered by the metal particles and taken out of the light emitting layer. Thus, the light emission efficiency of the EL element used for a planar light emitter can be improved.

Figure 6:
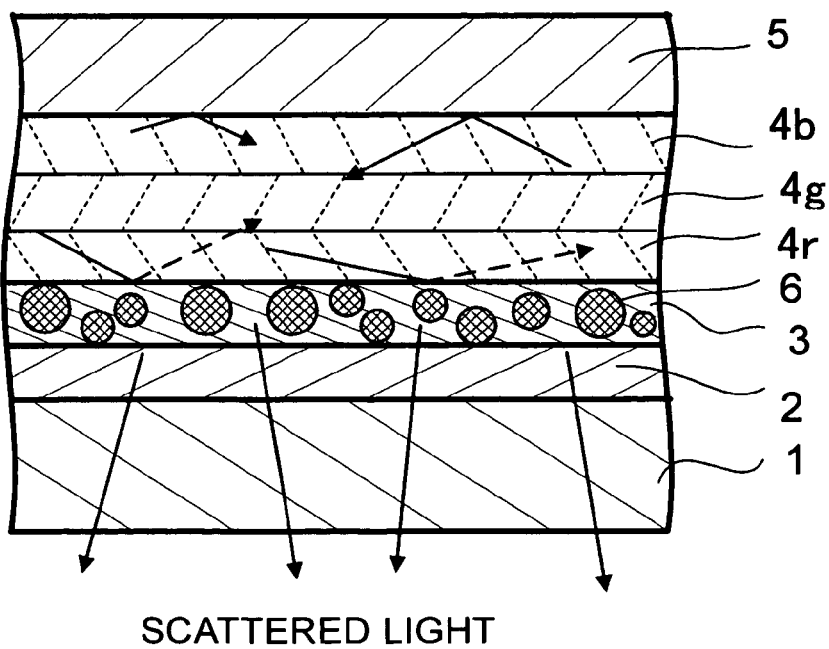
FIG. 6 is a schematic partial cross sectional view showing the EL element according to Embodiment 1 of the present invention.

FIG. 6 schematically shows an EL element having a structure in which a plurality of light emitting layers whose emitted light colors are different from one another are provided. As shown in FIG. 6, an R-light emitting layer 4r for red, a G-light emitting layer 4g for green, and a B-light emitting layer 4b for blue are stacked as the light emitting layers to realize a high-intensity white EL element. Therefore, when the plurality of light emitting layers whose emitted light wavelengths are different from one another and the light scattering layer in which the metal particles are dispersed are provided, necessary color light can be emitted and light confined in the light emitting layers can be taken out. Therefore, it is possible to obtain a planar light emitter in which the degree of freedom of color selection of light emitted from the planar light emitter is ensured to improve the light emission efficiency.

Figure 8:
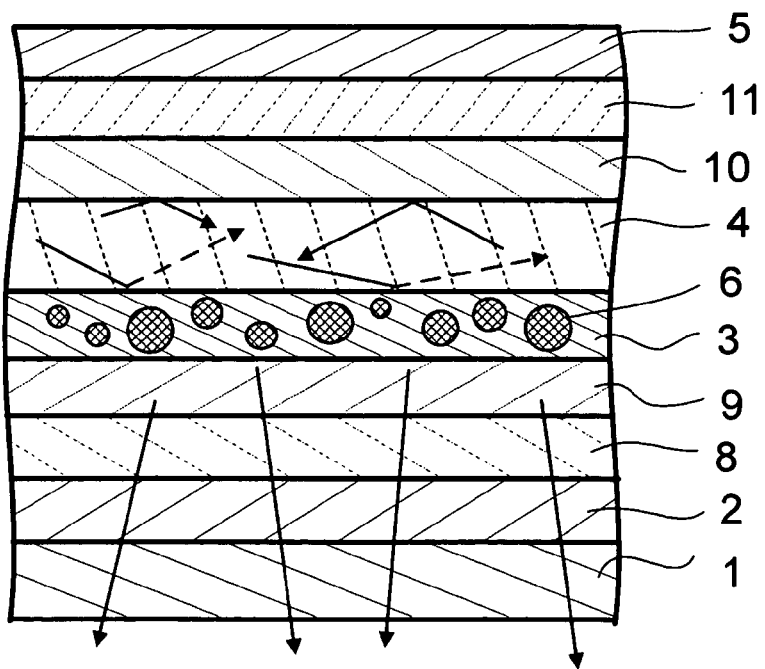
FIG. 8 is a schematic partial cross sectional view showing the EL element according to Embodiment 1 of the present invention.

FIG. 8 shows a detailed cross sectional structure of an organic EL element. In the case of the organic EL element, a hole and an electron recombine with each other in the light emitting layer to emit light. The first electrode layer 2, a hole injection layer 8, a hole transport layer 9, the light scattering layer 3, the light emitting layer 4 made of an organic EL material, an electron transport layer 10, an electron injection layer 11, and the second electrode layer 5 are stacked on the substrate 1 in this order. Therefore, the injection efficiency and the transport efficiency for holes and electrons which are injected from the first electrode layer and the second electrode layer can be improved to improve the light emission efficiency. The metal particles 6 are dispersed in the light scattering layer 3. Here, gold (Au) particles, each of which has a particle diameter of approximately 1 nm to 300 nm, are dispersed as the metal particles 6 in a silicon oxide film whose film thickness is 1 nm to 1 μm. A target in which Au particles are mixed with a silicon oxide or dispersed therein is prepared and the deposition is performed using an RF sputtering method to form the light scattering layer. In addition to the silicon oxide film, it is possible to use an oxide film such as an aluminum oxide film, a silicon nitride film, a silver oxide film, a tungsten oxide film, or a cobalt oxide film, or a ceramic material film. Ag, Pt, Co, W, and the like can be used, in addition to Au, for the metal particles. The particle diameter of each of the metal particles 6 is set for dispersion distribution in a film thickness range of the light scattering layer 3. Thus, the wavelength dispersion of the light emitted from the light emitting layer 4 can be caused.

Examples of a host material of an organic EL material used for the light emitting layer 4 include Alq3 and Be-benzoquinolinol (BeBq2). Examples of a dopant of the light emitting layer 4 include a fluorescent material and a phosphorescent material. In the case of the organic EL element, when electrons and holes are to be injected from both electrode layers for recombination to emit light, it is unnecessary to provide high energy to the injected electrons. Therefore, a driving voltage can be reduced.

The hole injection layer 8 and the hole transport layer 9 are provided between the first electrode layer 2 serving as an anode and the light emitting layer 4, which facilitates the injection and transport of holes from the first electrode layer 2. Materials of the layers are selected such that each ionization potential is between a work function of the first electrode layer 2 serving as the anode and an ionization potential of the light emitting layer 4. For example, a material such as a phthalocyan derivative or a triazole derivative can be used. The electron injection layer 11 and the electron transport layer 10 are provided between the light emitting layer 4 and the second electrode layer 5, which facilitates the injection and transport of electrons from the second electrode layer 5. Materials of the layers are selected such that each electron affinity is between a work function of the second electrode layer 5 and an electron affinity of the light emitting layer 4. For example, a material such as a triazole derivative or a triazine derivative can be used.

In the various structures as described above, the second electrode layer 5 is a metal film such as Al, or a transparent conductive film which is made of a ITO and formed using a sputtering method or a vacuum evaporation method. In this embodiment except for the case of FIG. 2, the light emitted from the light emitting layer(s) 4 (4b, 4g, and 4r) and the light scattered by the light scattering layer 3 are taken out from the substrate 1 side. When the light beams are taken out from the second electrode layer 5 side which is the upper portion side, it is only necessary that an opaque metal electrode be used as the first electrode layer 2 and a transparent electrode layer made of ITO or the like be used as the second electrode layer 5.

The light emitting layer 4 made of an inorganic material is formed by the deposition of an EL material in which ZnS is doped with Sm or Tb using an electron beam evaporation method. A ZnS EL element is an inorganic EL element, so a driving voltage becomes higher.

In this embodiment, the glass substrate is used as the substrate 1. A substrate made of an elastic material, such as a transparent plastic substrate can be used. In this embodiment, the structure in which the light is taken out to the substrate side is employed, so the transparent electrode layer is used as the first electrode layer 2. To be specific, an oxide of indium and tin (hereinafter referred to as ITO) is deposited using a vacuum evaporation method. An oxide of indium and zinc can be used instead of ITO.

Embodiment 2

Figure 7:
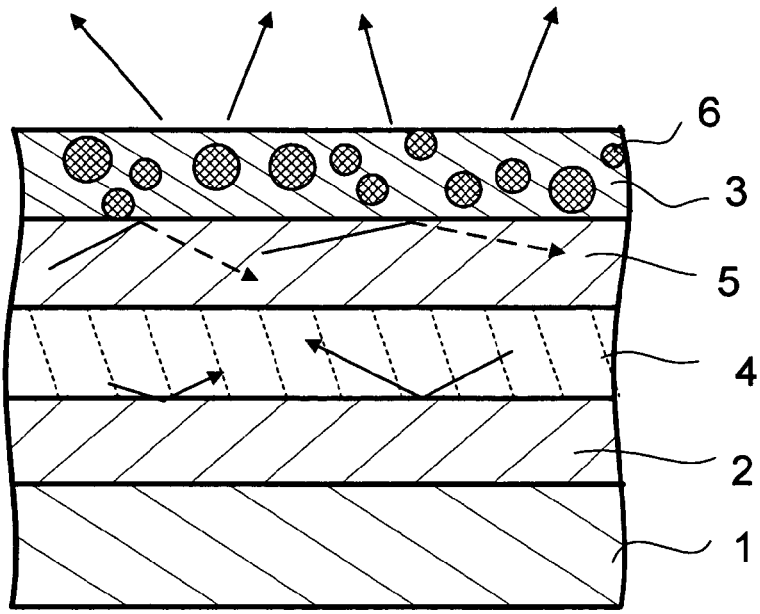
FIG. 7 is a schematic partial cross sectional view showing an EL element according to Embodiment 2 of the present invention.

FIG. 7 is a schematic partial view showing a cross sectional structure of an EL element according to this embodiment. The EL element according to this embodiment is significantly different from that according to Embodiment 1 in that the light scattering layer 3 is not provided between the first electrode layer and the light emitting layer but provided on the second electrode layer 5. Other structures and structural arrangements are identical to those in Embodiment 1 and the redundant descriptions are omitted here. In the structure according to this embodiment, an opaque metal electrode is used as the second electrode layer 2 and a transparent electrode layer is used as the second electrode layer 5, thereby obtaining scattered light from an upper side of FIG. 7. The light emitting layer 4 is in contact with the first electrode layer 2 and the second electrode layer 5. Therefore, there is an advantage in that the drop of a voltage applied to the light emitting layer 4 or the inhibition of charges injected thereto is prevented by the light scattering layer 3.

Embodiment 3

Figure 9:
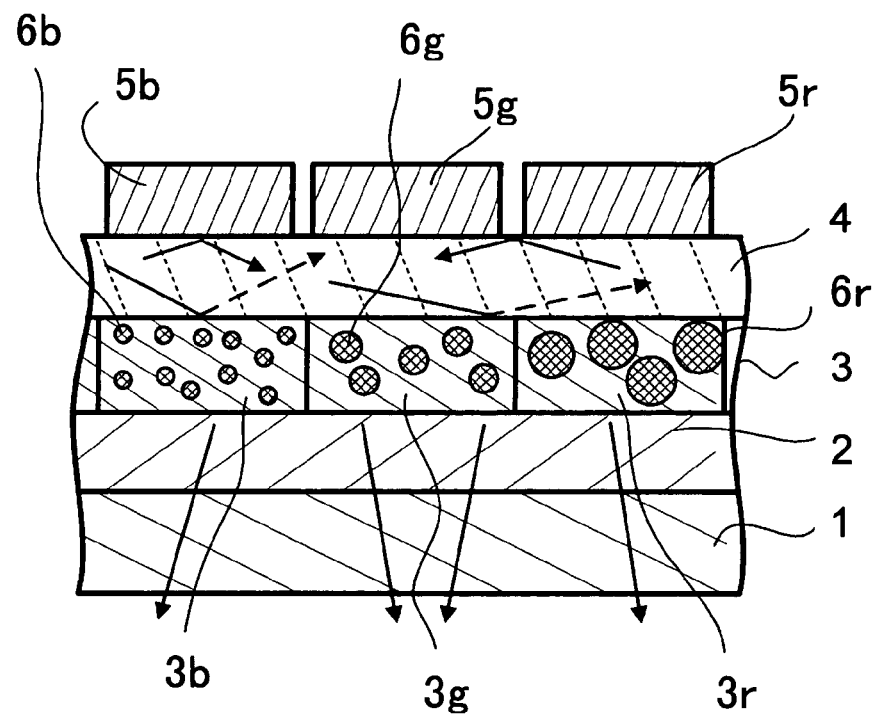
FIG. 9 is a schematic partial cross sectional view showing an EL element according to Embodiment 3 of the present invention.

FIG. 9 is a partial cross sectional view showing an EL element according to this embodiment. A structure in which an EL element according to the present invention is used for a display device will be described. An example of an EL element in which a plurality of electrodes separated from one another are formed corresponding to three kinds of light scattering regions will be described here. As shown in FIG. 9, the first electrode layer 2 is formed on the transparent substrate 1 made of glass or the like. The first electrode layer 2 is one of a plurality of separated stripe electrode groups extending in a direction parallel to the paper surface of FIG. 9. The light scattering layer 3 is formed on the first electrode layer 2. The light emitting layer 4 is formed on the light scattering layer 3. A second electrode layer-B 5b, a second electrode layer-G 5g, and a second electrode layer-R 5r which are separated from one another and provided in a stripe shape so as to intersect with the second electrode layer 2 are formed on the light emitting layer 4. Each stack portion in which the first electrode layer 2 and the second electrode layer 5 overlap each other constitutes a pixel. When a voltage is applied between the first electrode layer 2 and the second electrode layer-B 5b, a light emitting layer region sandwiched therebetween emits light. When a voltage is applied between the first electrode layer 2 and the second electrode layer-G 5g, a light emitting layer region sandwiched therebetween emits light. When successive electrode selection is performed as described above, a dot matrix display can be achieved.

The light scattering layer 3 includes a light scattering region-B 3b, a light scattering region-G 3g, and a light scattering region-R 3r which are provided corresponding to pixels. Average particle diameters of the metal particles 6 of the respective light scattering regions are different from one another. That is, the average particle diameter of the metal particles-G 6g of the light scattering region-G 3g is larger than the average particle diameter of the metal particles-B 6b of the light scattering region-B 3b. The average particle diameter of the metal particles-R 6r of the light scattering region-R 3r is larger than the average particle diameter of the metal particles-G 6g of the light scattering region-G 3g. Therefore, when a metal particle shape of each of the light scattering regions is adjusted, properties of scattered light, for example, a wavelength characteristic of the scattered light and directivity thereof can be changed.

As described above, in a case where the plasmon is excited in the metal particles 6, when the particle diameter of each of the metal particles increases, the wavelength of the incident light is shifted to the long-wavelength side to produce the scattered light. In this embodiment, a wavelength of light scattered by the metal particles-G 6g is longer than that of light scattered by the metal particles-B 6b and a wavelength of light scattered by the metal particles-R 6r is longer than that of light scattered by the metal particles-G 6g. For example, assume that the light emitting layer 4 is an EL light emitting layer for blue light or ultraviolet light and Au particles are used as the metal particles. Then, when the average particle diameter of the metal particles-B 6b is set to approximately 50 nm, the average particle diameter of the metal particles-G 6g is set to approximately 100 nm, and the average particle diameter of the metal particles-R 6r is set to approximately 150 nm, a blue light beam, a green light beam, and a red light beam can be obtained as the respective scattered light beams.

Therefore, the light beams are scattered by the light scattering regions of the light scattering layer 3 which correspond to respective pixels to produce scattered light beams whose colors are different from one another. When a plurality of electrodes constituting the first electrode layer 2 and a plurality of electrodes constituting the second electrode layer 5 are successively scanned, an EL element capable of performing full color display can be obtained.

The light scattering layer 3 shown in FIG. 9 can be produced as follows. Au particles or Ag particles are mixed with a target made of a material used for the light scattering layer 3 or dispersed in the target. The film formation is performed by an RF sputtering method using the target. A metal mask in which a hole is provided for each group including, for example, three pixels is used for film formation. A light scattering layer 3 having an average particle diameter is formed and then the metal mask is shifted by one pixel. Next, the film formation is performed in a different RF sputtering condition. When such an operation is repeated, the light scattering layer 3 having different average particle diameters can be obtained.

Figure 10:
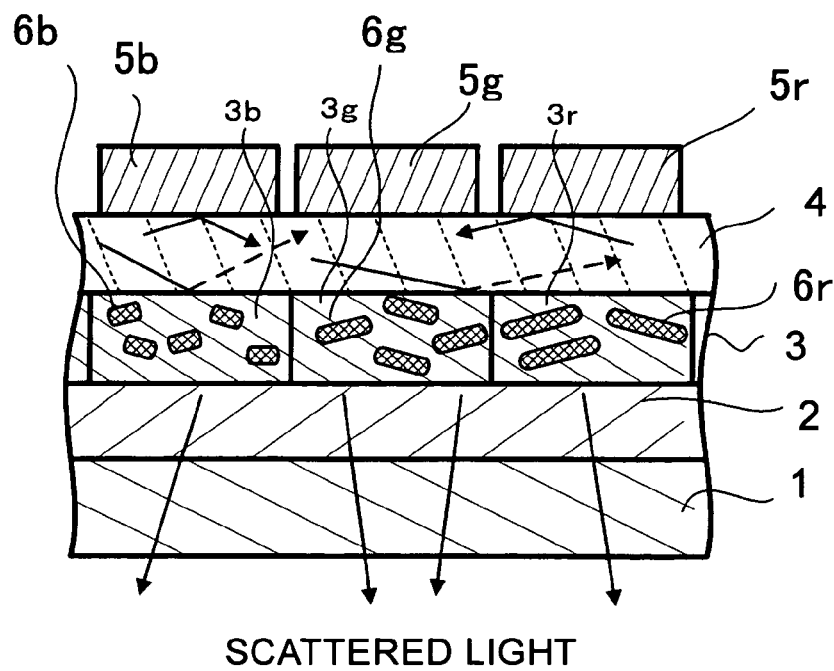
FIG. 10 is a schematic partial cross sectional view showing the EL element according to Embodiment 3 of the present invention.

FIG. 10 schematically shows an EL element having a structure in which not spherical particles but aspherical particles each having a major axis and a minor axis are used as the metal particles 6 contained in the light scattering layer 3. The aspherical particles are, for example, cylindrical or rectangular particles. Assuming that a ratio of the minor axis of each of the metal particles 6 to the major axis thereof is a shape ratio, as the shape ratio increases, a wavelength of the maximum scattered light is shifted to the long-wavelength side when the incident light is scattered by the metal particles 6 to produce scattered light. That is, an average shape ratio of the metal particles-G 6g of the light scattering region-G 3g is larger than an average shape ratio of the metal particles-B 6b of the light scattering region-B 3b. An average shape ratio of the metal particles-R 6r of the light scattering region-R 3r is larger than an average shape ratio of the metal particles-G 6g of the light scattering region-G 3g. As a result, a wavelength of light scattered by the metal particles-G 6g is longer than that of light scattered by the metal particles-B 6b and a wavelength of light scattered by the metal particles-R 6r is longer than that of light scattered by the metal particles-G 6g. Therefore, a full color EL element can be obtained as in the case described with reference to FIG. 9.

Figure 11:
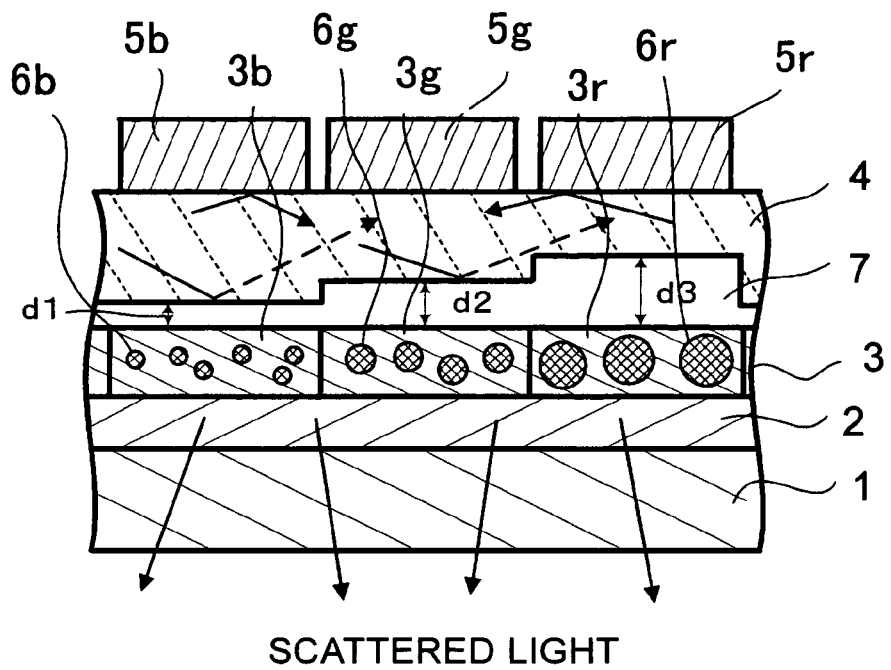
FIG. 11 is a schematic partial cross sectional view showing the EL element according to Embodiment 3 of the present invention.

FIG. 11 schematically shows an EL element having a structure in which the dielectric layer 7 is provided between the light scattering layer 3 and the light emitting layer 4. In this structure, a film thickness of the dielectric layer 7 is different for each of pixel regions. That is, as shown in FIG. 11, the film thickness of the dielectric layer 7 increases, as a size of each of the metal particles 8 disposed in the light scattering layer becomes larger. Intensities of light beams scattered from the metal particles-B 6b, the metal particles-G 6g, and the metal particles-R 6r which correspond to the respective pixel regions are different from one another. Therefore, the film thickness of the dielectric layer 7 is adjusted for each of the pixel regions to make the intensities of the scattered light beams equal to one another. The film thickness of the dielectric layer 7 is set to, for example, a film thickness capable of allowing a tunnel current to flow.

Figure 12:
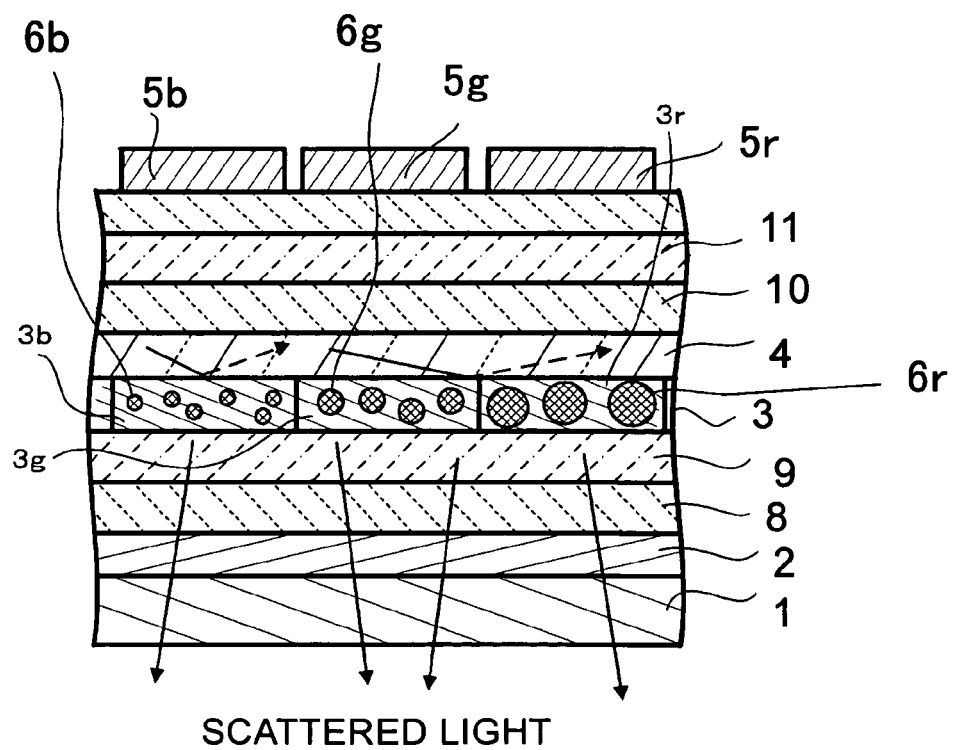
FIG. 12 is a schematic partial cross sectional view showing the EL element according to Embodiment 3 of the present invention.
Figure 13:
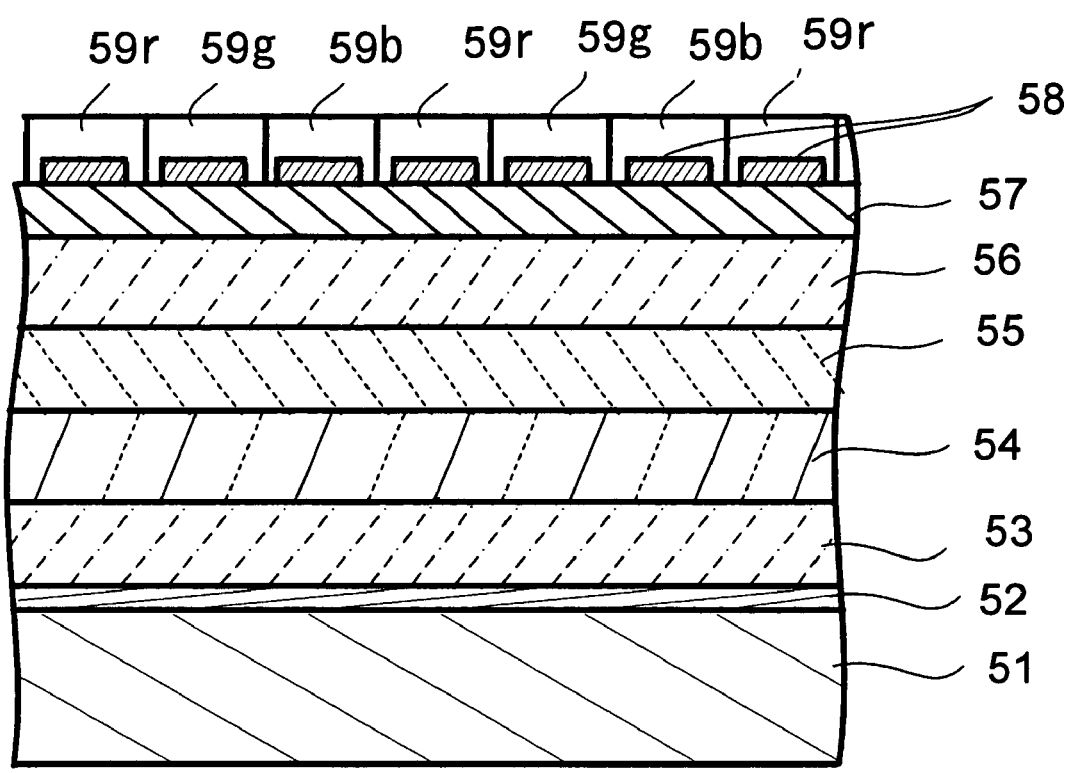
FIG. 13 is a schematic partial cross sectional view showing a structure of an EL element known up to now.

FIG. 12 shows a detailed cross sectional structure of an organic EL element. In this structure, the hole injection layer 8 and the hole transport layer 9 are provided between the light scattering layer 3 and the first electrode layer 2. In addition, the electron transport layer 10 and the electron injection layer 11 are provided between the light emitting layer 4 made of an organic EL material and the second electrode layer 5. According to such a structure, the injection efficiency for holes and electrons is improved, so low-voltage driving is possible.

The light scattering layer 3 including the respective pixel regions as shown in FIGS. 9 to 12 can be replaced by a light emitting layer whose permittivity is different for each region. That is, it is assumed that the light scattering region-B 3b in which the metal particles-B 6b are dispersed, the light scattering region-G 3g in which the metal particles-G 6g are dispersed, and the light scattering region-R 3r in which the metal particles-R 6r are dispersed have permittivities different from one another. Therefore, the intensity peaks of scattered light beams can be further changed.

In each of the structures as described above, the metal particles 6 which are the spherical particles or the cylindrical or rectangular particles are described. However, the present invention is not limited thereto and thus the metal particles 6 may be polygonal particles or complex-shaped particles.

Figure 15:
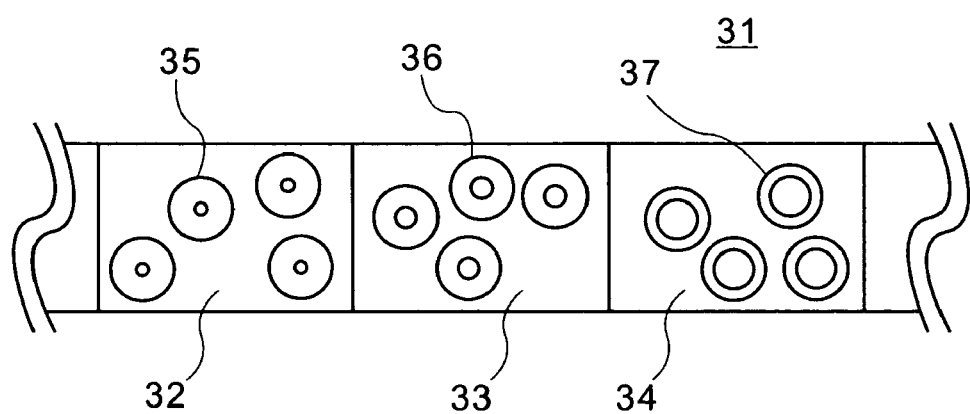
FIG. 15 is a schematic partial cross sectional view showing a light scattering layer used in each of Embodiments 1, 2, and 3 of the present invention.

FIG. 15 schematically shows a light scattering layer 31 in which metal particles each having a structure in which the metal thin film 25 is provided on the surface of the core portion made of a dielectric material (see FIG. 14) are dispersed in each light scattering region. That is, the light scattering layer 3 shown in FIGS. 9 to 12 can be replaced by the light scattering layer 31. In FIG. 15, the layers located above and below the light scattering layer 31 are omitted. The metal particles are used in which the absolute value of the diameter of the core portion and the absolute value of the thickness of the metal thin film or the ratio therebetween are adjusted. Therefore, wavelength dependence is given to the scattering efficiency of each light scattering region. In the light scattering layer 31, metal particles 35 each having a metal film thickness relatively thicker than the thickness of the core portion are dispersed in a portion 32 located immediately below the second electrode layer-B. Metal particles 37 each having a metal film thickness relatively thinner than the thickness of the core portion are dispersed in a portion 34 located immediately below the second electrode layer-R. Metal particles 36 each having a thickness ratio between the core portion and the metal thin film is an intermediate value between thickness ratios therebetween in the metal particles dispersed in both side portions are dispersed in a portion 33 located immediately below the second electrode layer-G. In the light scattering layer 31 having such a structure, of light emitted from the light emitting layer (not shown), a short-wavelength component is scattered by the metal particles 35 at high efficiency, a long-wavelength component is scattered by the metal particles 37 at high efficiency, and an intermediate-wavelength component is scattered by the metal particles 36 at high efficiency. Therefore, an EL element for full color display device can be obtained.

Figure 16:
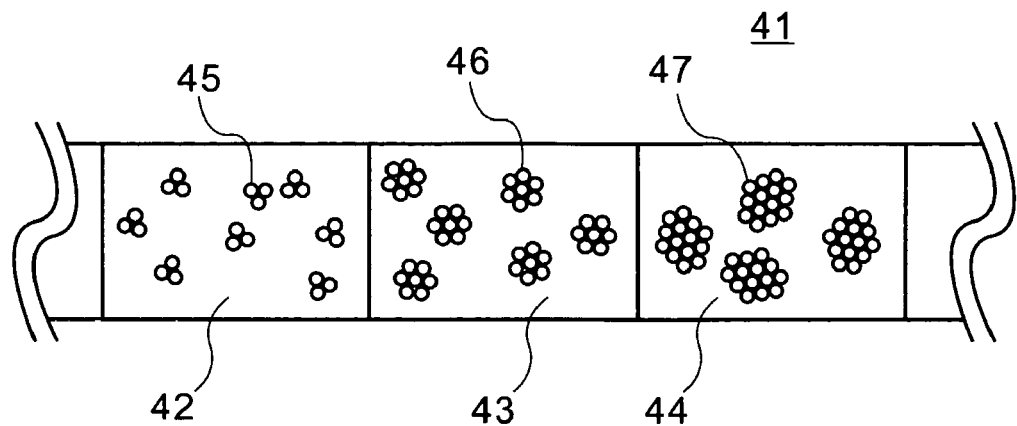
FIG. 16 is a schematic partial cross sectional view showing the light scattering layer used in each of Embodiments 1, 2, and 3 of the present invention.

FIG. 16 schematically shows a light scattering layer 41 in which clusters in each of which a plurality of particles are coagulated are used as the metal particles. That is, the light scattering layer 3 shown in FIGS. 9 to 12 can be replaced by the light scattering layer 41. In FIG. 16, the layers located above and below the light scattering layer 41 are omitted. In the light scattering layer 41, metal particle clusters 45 in each of which a relatively small number of particles (for example, several to ten particles) are coagulated are dispersed in the portion 42 located immediately below the second electrode layer-B. Metal particle clusters 47 in each of which a relatively large number of particles (for example, several tens to one hundred particles) are coagulated are dispersed in the portion 44 located immediately below the second electrode layer-R. Metal particle clusters 46 in each of which the number of coagulated particles is an intermediate value between the numbers of particles described above are dispersed in the portion 43 located immediately below the second electrode layer-G. In the light scattering layer 41 having such a structure, of light emitted from the light emitting layer (not shown), a short-wavelength component is scattered by the metal particle clusters 45 at high efficiency, a long-wavelength component is scattered by the metal particle clusters 47 at high efficiency, and an intermediate-wavelength component is scattered by the metal particle clusters 46 at high efficiency. Therefore, an EL element for full color display device can be obtained.

In the structure according to each of the embodiments, the passive matrix display device is described in which the first electrode layer 2 and the second electrode layer 5 are used for the plurality of stripe electrodes and the pixel is provided at each of the intersection portions therebetween. An EL element may be employed in which an active matrix structure in which a TFT element and the like are formed at each pixel is used, the second electrode layer is used as a pixel electrode, and the light scattering layer 3 is provided for each pixel.

What is claimed is:
1. An electroluminescence element, comprising:
   a first electrode layer;
   a second electrode layer;
   a light emitting layer provided between the first electrode layer and the second electrode layer; and
   a light scattering layer having metal particles dispersed therein, the light scattering layer being disposed on the second electrode layer.

2. An electroluminescence element according to claim 1; wherein the light scattering layer comprises a film in which the metal particles are disposed in a dielectric material, each of the metal particles having a diameter in a range of 1 nm to 300 nm.

3. An electroluminescence element according to claim 1; wherein the light scattering layer comprises a film in which the metal particles are disposed in a dielectric material, the particles having different aspect ratios (minor axis/major axis).

4. An electroluminescence element according to claim 1; wherein each of the metal particles has a particle diameter substantially equal to a thickness of the light scattering layer.

5. An electroluminescence element according to claim 1; wherein each of the metal particles comprises a substantially spherical core portion containing a dielectric material and a thin metal film formed on a surface of the core portion.

6. An electroluminescence element according to claim 5; wherein the metal particles comprise a plurality of different kinds of metal particles each having the core portion and the thin metal film that are different in size from those of the others of the metal particles.

7. An electroluminescence element according to claim 1; wherein the metal particles comprise a plurality of clusters of coagulated metal particles.

8. An electroluminescence element according to claim 1; wherein at least one of the first electrode layer and the second electrode layer comprises a plurality of electrodes separated from one another and overlapping with the other of the first electrode layer and the second electrode layer to provide stack portions forming pixels; and wherein the light scattering layer comprises a first light scattering region corresponding to a first one of the pixels and a second light scattering region corresponding to a second one of the pixels, the first light scattering region emitting scattered light having a wavelength characteristic different from a wavelength characteristic of scattered light emitted from the second light scattering region.

9. An electroluminescence element according to claim 1; wherein at least one of the first electrode layer and the second electrode layer comprises a plurality of electrodes separated from one another and overlapping with the other of the first electrode layer and the second electrode layer to provide stack portions forming pixels; and wherein the light scattering layer having a first light scattering region having the metal particles and corresponding to a first one of the pixels and a second light scattering region having the metal particles and corresponding to a second one of the pixels, the metal particles in the first light scattering region have a shape different from that of the metal particles in the second light scattering region.

10. An electroluminescence element according to claim 9; wherein an average particle diameter of the metal particles in the second light scattering region is larger than an average particle diameter of the metal particles in the first light scattering region.

11. An electroluminescence element according to claim 9; wherein an average aspect ratio (minor axis/major axis) of the metal particles in the second light scattering region is greater than an average aspect ratio of the metal particles in the first light scattering region.

12. An electroluminescence element according to claim 9; wherein each of the metal particles comprises a substantially spherical core portion containing a dielectric material and a thin metal film formed on a surface of the core portion; and wherein the core portion and the thin metal film of each of the metal particles in the first light scattering region differ in size from the core portion and the thin metal film of each of the metal particles in the second light scattering region.

13. An electroluminescence element according to claim 1; wherein at least one of the first electrode layer and the second electrode layer comprises a plurality of electrodes separated from one another and overlapping with the other of the first electrode layer and the second electrode layer to provide stack portions forming pixels; and wherein the light scattering layer comprises a first dielectric layer including a first light scattering region corresponding to a first one of the pixels and a second dielectric layer including a second light scattering region corresponding to a second one of the pixels, the first dielectric region having a permittivity different from that of the second dielectric region.

14. An electroluminescence element according to claim 1; further comprising a dielectric layer disposed between the light emitting layer and the light scattering layer; wherein at least one of the first electrode layer and the second electrode layer comprises a plurality of electrodes separated from one another and overlapping with the other of the first electrode layer and the second electrode layer to provide stack portions forming pixels; wherein the light scattering layer comprises a first light scattering region having the metal particles and corresponding to a first one of the pixels and a second light scattering region having the metal particles and corresponding to a second one of the pixels; and wherein the dielectric layer has a variable film thickness between a portion corresponding to the first light scattering region and a portion corresponding to the second light scattering region.

15. An electroluminescence element according to claim 1; wherein at least one of the first electrode layer and the second electrode layer is divided into parts corresponding to three primary colors and overlapping with the other of the first electrode layer and the second electrode layer to provide stack portions forming a first pixel, a second pixel, and a third pixel; wherein the light scattering layer comprises a first light scattering region having the metal particles and corresponding to the first pixel, a second light scattering region having the metal particles and corresponding to the second pixel, and a third light scattering region having the metal particles and corresponding to the third pixel; and wherein a size of each of the metal particles in the first light scattering region is in a range of 10 nm to 50 nm, a size of each of the metal particles in the second light scattering region is in a range of 50 nm to 90 nm, and a size of each of the metal particles in the third light scattering region is in a range of 90 nm to 140 nm.

16. An electroluminescence element according to claim 1; wherein each of the metal particles is made of a material selected from the group consisting of Au, Ag, Pt, Co, W, and an alloy thereof.

17. An electroluminescence element according to claim 1; wherein each of the metal particles comprises a surface plasmon excited particle.

18. An electroluminescence element, comprising:
a first electrode layer;
a second electrode layer;
a light emitting layer provided between the first electrode layer and the second electrode layer;
a first light scattering layer having metal particles dispersed therein, the light scattering layer being disposed between the first electrode layer and the light emitting layer; and
a second light scattering layer disposed between the second electrode layer and the light emitting layer.

19. An electroluminescence element according to claim 18; wherein the light scattering layer comprises a film in which the metal particles are disposed in a dielectric material, each of the metal particles having a diameter in a range of 1 nm to 300 nm.

20. An electroluminescence element according to claim 18; wherein the light scattering layer comprises a film in which the metal particles are disposed in a dielectric material, the particles having different aspect ratios (minor axis/major axis).

21. An electroluminescence element according to claim 18; wherein each of the metal particles has a particle diameter substantially equal to a thickness of the light scattering layer.

22. An electroluminescence element according to claim 18; wherein each of the metal particles comprises a substantially spherical core portion containing a dielectric material and a thin metal film formed on a surface of the core portion.

23. An electroluminescence element according to claim 22; wherein the metal particles comprise a plurality of different kinds of metal particles each having the core portion and the thin metal film that are different in size from those of the others of the metal particles.

24. An electroluminescence element according to claim 18; wherein the metal particles comprise a plurality of clusters of coagulated metal particles.

25. An electroluminescence element according to claim 18; wherein at least one of the first electrode layer and the second electrode layer comprises a plurality of electrodes separated from one another and overlapping with the other of the first electrode layer and the second electrode layer to provide stack portions forming pixels; and wherein the light scattering layer comprises a first light scattering region corresponding to a first one of the pixels and a second light scattering region corresponding to a second one of the pixels, the first light scattering region emitting scattered light having a wavelength characteristic different from a wavelength characteristic of scattered light emitted from the second light scattering region.

26. An electroluminescence element according to claim 18; wherein at least one of the first electrode layer and the second electrode layer comprises a plurality of electrodes separated from one another and overlapping with the other of the first electrode layer and the second electrode layer to provide stack portions forming pixels; and wherein the light scattering layer having a first light scattering region having the metal particles and corresponding to a first one of the pixels and a second light scattering region having the metal particles and corresponding to a second one of the pixels, the metal particles in the first light scattering region have a shape different from that of the metal particles in the second light scattering region.

27. An electroluminescence element according to claim 26; wherein an average particle diameter of the metal particles in the second light scattering region is larger than an average particle diameter of the metal particles in the first light scattering region.

28. An electroluminescence element according to claim 26; wherein an average aspect ratio (minor axis/major axis) of the metal particles in the second light scattering region is greater than an average aspect ratio of the metal particles in the first light scattering region.

29. An electroluminescence element according to claim 26; wherein each of the metal particles comprises a substantially spherical core portion containing a dielectric material and a thin metal film formed on a surface of the core portion; and wherein the core portion and the thin metal film of each of the metal particles in the first light scattering region differ in size from the core portion and the thin metal film of each of the metal particles in the second light scattering region.

30. An electroluminescence element according to claim 18; wherein at least one of the first electrode layer and the second electrode layer comprises a plurality of electrodes separated from one another and overlapping with the other of the first electrode layer and the second electrode layer to provide stack portions forming pixels; and wherein the light scattering layer comprises a first dielectric layer including a first light scattering region corresponding to a first one of the pixels and a second dielectric layer including a second light scattering region corresponding to a second one of the pixels, the first dielectric region having a permittivity different from that of the second dielectric region.

31. An electroluminescence element according to claim 18; further comprising a dielectric layer disposed between the light emitting layer and the light scattering layer; wherein at least one of the first electrode layer and the second electrode layer comprises a plurality of electrodes separated from one another and overlapping with the other of the first electrode layer and the second electrode layer to provide stack portions forming pixels; wherein the light scattering layer comprises a first light scattering region having the metal particles and corresponding to a first one of the pixels and a second light scattering region having the metal particles and corresponding to a second one of the pixels; and wherein the dielectric layer has a variable film thickness between a portion corresponding to the first light scattering region and a portion corresponding to the second light scattering region.

32. An electroluminescence element according to claim 18; wherein at least one of the first electrode layer and the second electrode layer is divided into parts corresponding to three primary colors and overlapping with the other of the first electrode layer and the second electrode layer to provide stack portions forming a first pixel, a second pixel, and a third pixel; wherein the light scattering layer comprises a first light scattering region having the metal particles and corresponding to the first pixel, a second light scattering region having the metal particles and corresponding to the second pixel, and a third light scattering region having the metal particles and corresponding to the third pixel; and wherein a size of each of the metal particles in the first light scattering region is in a range of 10 nm to 50 nm, a size of each of the metal particles in the second light scattering region is in a range of 50 nm to 90 nm, and a size of each of the metal particles in the third light scattering region is in a range of 90 nm to 140 nm.

33. An electroluminescence element according to claim 18; wherein each of the metal particles is made of a material selected from the group consisting of Au, Ag, Pt, Co, W, and an alloy thereof.

34. An electroluminescence element according to claim 18; wherein each of the metal particles comprises a surface plasmon excited particle.

35. An electroluminescence element, comprising:
a first electrode layer;
a second electrode layer;
a light emitting layer provided between the first electrode layer and the second electrode layer; and
a light scattering layer having metal particles dispersed therein, the light scattering layer being disposed between the first electrode layer and the light emitting layer, and the metal particles being made of a material selected from the group consisting of Au, Ag, Pt, Co, W, and an alloy thereof.

36. An electroluminescence element, comprising:
a first electrode layer;
a second electrode layer;
a light emitting layer provided between the first electrode layer and the second electrode layer; and
a light scattering layer having metal particles dispersed therein, the light scattering layer being disposed between the first electrode layer and the light emitting layer, and the metal particles comprising surface plasmon excited particles.

* * * * *